US012016155B2

(12) United States Patent
Lopez

(10) Patent No.: US 12,016,155 B2
(45) Date of Patent: Jun. 18, 2024

(54) HEAT SINK WITH IMPROVED THERMAL CONDUCTIVITY

(71) Applicants: Continental Automotive France, Toulouse (FR); Continental Automotive GmbH, Hannover (DE)

(72) Inventor: Philippe Lopez, Toulouse (FR)

(73) Assignees: Continental Automotive France, Toulouse (FR); Continental Automotive GmbH, Hannover (DE)

( * ) Notice: Subject to any disclaimer, the term of this patent is extended or adjusted under 35 U.S.C. 154(b) by 445 days.

(21) Appl. No.: 17/257,924

(22) PCT Filed: Jul. 11, 2019

(86) PCT No.: PCT/EP2019/068717
§ 371 (c)(1),
(2) Date: Jan. 5, 2021

(87) PCT Pub. No.: WO2020/011937
PCT Pub. Date: Jan. 16, 2020

(65) Prior Publication Data
US 2021/0289665 A1    Sep. 16, 2021

(30) Foreign Application Priority Data
Jul. 12, 2018   (FR) ..................................... 1856426

(51) Int. Cl.
*H05K 7/20*    (2006.01)
*F28F 3/02*    (2006.01)
(Continued)

(52) U.S. Cl.
CPC ......... *H05K 7/20409* (2013.01); *F28F 3/022* (2013.01); *F28F 3/06* (2013.01);
(Continued)

(58) Field of Classification Search
CPC ............. H05K 7/20409; H05K 7/2039; H05K 7/20509; F28F 3/022; F28F 3/06; F28F 21/02; F28F 2215/02
(Continued)

(56) References Cited

U.S. PATENT DOCUMENTS 5,285,350 A * 2/1994 Villaume .............. H01L 23/467
257/E23.099
5,869,891 A    2/1999 Rostoker et al.
(Continued)

FOREIGN PATENT DOCUMENTS

CN    1513068 A    7/2004
CN    1893803 A    1/2007
(Continued)

OTHER PUBLICATIONS

International Search Report and Written Opinion for International Application No. PCT/EP2019/068717, dated Oct. 4, 2019, with partial English translation, 9 pages.
(Continued)

*Primary Examiner* — Zhengfu J Feng
(74) *Attorney, Agent, or Firm* — BUCHANAN INGERSOLL & ROONEY PC

(57) ABSTRACT

A heat sink including a first face in contact with electronic components generating heat to be removed and a second face in contact with the medium into which to dissipate the heat generated by the electronic components, including: at least one device for enhancing the thermal conductivity including a dome-shaped surface, a pin and a lateral section of revolution about the pin, the dome-shaped surface being connected to one end of a pin and to the lateral section of revolution, the dome-shaped surface being arranged on the second-face side, the free end of the pin being arranged on the first-face side.

9 Claims, 2 Drawing Sheets

(51) Int. Cl.
*F28F 3/06* (2006.01)
*F28F 21/02* (2006.01)

(52) U.S. Cl.
CPC ........... *F28F 21/02* (2013.01); *H05K 7/2039* (2013.01); *F28F 2215/02* (2013.01)

(58) Field of Classification Search
USPC ....................................................... 361/704
See application file for complete search history.

(56) References Cited

U.S. PATENT DOCUMENTS

| | | | |
|---|---|---|---|
| 6,025,643 | A | 2/2000 | Auger |
| 6,237,223 | B1* | 5/2001 | McCullough ....... H01L 23/4275 |
| | | | 29/890.032 |
| 6,844,054 | B2 | 1/2005 | Whatley |
| 9,233,438 | B2 | 1/2016 | Phelan et al. |
| 2002/0182397 | A1* | 12/2002 | Whatley ............... H01L 23/373 |
| | | | 428/293.1 |
| 2007/0001292 | A1 | 1/2007 | Ohta et al. |
| 2007/0131406 | A1* | 6/2007 | Tsai ...................... H01L 23/467 |
| | | | 257/722 |
| 2009/0034204 | A1 | 2/2009 | Wayman et al. |
| 2010/0282446 | A1 | 11/2010 | Yamamoto et al. |
| 2014/0116651 | A1 | 5/2014 | Tong et al. |
| 2014/0262449 | A1* | 9/2014 | Gektin ................ H01L 23/4006 |
| | | | 29/825 |
| 2017/0314870 | A1* | 11/2017 | Lin .......................... F28F 3/08 |
| 2018/0261522 | A1* | 9/2018 | Brunschwiler ..... H01L 21/4882 |

FOREIGN PATENT DOCUMENTS

| | | |
|---|---|---|
| CN | 101505029 A | 8/2009 |
| CN | 101776412 A | 7/2010 |
| CN | 101910722 A | 12/2010 |
| CN | 102803888 A | 11/2012 |
| CN | 202565644 U | 11/2012 |
| CN | 103781328 A | 5/2014 |
| CN | 205726867 U | 11/2016 |
| CN | 107529322 A | 12/2017 |
| JP | 1125869 A | 1/1999 |
| KR | 20080012515 A | 2/2008 |
| TW | M321686 U | 11/2007 |
| WO | 2010005435 A1 | 1/2010 |

OTHER PUBLICATIONS

International Search Report and Written Opinion for International Application No. PCT/EP2019/068717, dated Oct. 4, 2019, 14 pages (French).
English Translation of the Written Opinion for International Application No. PCT/EP2019/068717, dated Oct. 4, 2019, 7 pages.
Chinese Office Action for Chinese Application No. 201980046450.5, dated Feb. 2, 2023 with translation, 19 pages.

* cited by examiner

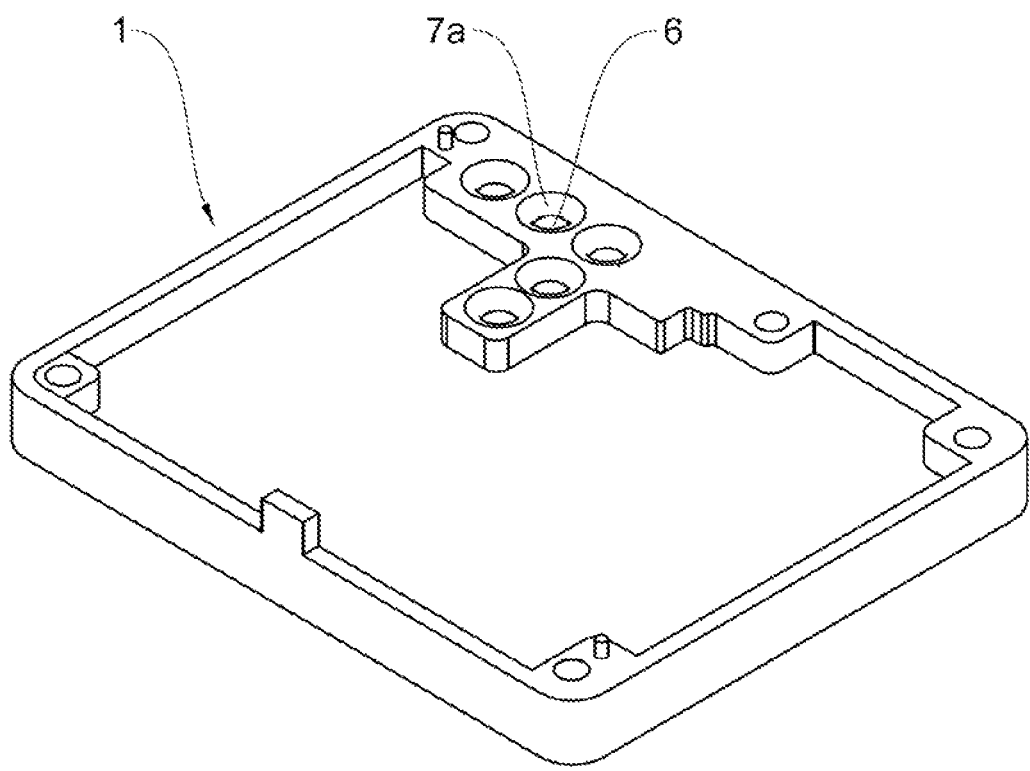

HEAT SINK WITH IMPROVED THERMAL CONDUCTIVITY

CROSS REFERENCE TO RELATED APPLICATIONS

This application is the U.S. National Phase Application of PCT International Application No. PCT/EP2019/068717, filed Jul. 11, 2019, which claims priority to French Patent Application No. 1856426, filed Jul. 12, 2018, the contents of such applications being incorporated by reference herein.

FIELD OF THE INVENTION

The technical field of the invention is that of heat sinks for electronics, and more particularly such sinks made of composite materials.

BACKGROUND OF THE INVENTION

Electronic components release heat through Joule heating, which is of no consequence as long as the components are arranged in an isolated manner and in an environment promoting thermal dissipation. However, as soon as they are used within circuit boards or integrated into integrated circuits, such as processors, the release of heat from an electronic component can become problematic. This is also the case for power electronic components such as MOSFET (acronym for "metal-oxide-semiconductor field-effect transistor") insulated-gate field-effect transistors.

Indeed, such a circuit board or processor may be subjected to a significant temperature rise if the release of heat from their electronic components is not in balance with the dissipation of heat from the circuit board or processor. Such a temperature rise can decrease the service life of electronic components, or even limit their operation or destroy them.

To avoid this, it is common practice to use a heat sink made of a thermally conductive material, arranged substantially in contact with the electronic components that are the source of the heat release to be removed. Aluminum is generally used for such heat sinks because of its cost, its ease of use during manufacture and its good thermal conductivity. Copper may also be used because of its better thermal conductivity despite a higher density, making copper heat sinks heavier than their aluminum counterparts.

In some cases, a thermally conductive compound is arranged between the electronic components and the heat sink in order to enhance the surface area and thermal conductivity of the contact region. Such a thermally conductive compound may be of the semi-fluid or thermal-pad type.

Through the constant lowering of the pollution levels tolerated in the automotive environment, it is necessary to improve the efficiency of the various devices installed in a motor vehicle, in particular in terms of their mass. Specifically, decreasing the overall mass of the vehicle makes it possible to decrease pollution levels and increase the range of motor vehicles.

SUMMARY OF THE INVENTION

In this regard, there is a need for an improvement in the mass of the various heat sinks for regulating the temperature of the various onboard computers.

An aspect of the invention relates to a heat sink comprising a first face in contact with electronic components generating heat to be removed and a second face in contact with the medium into which to dissipate the heat generated by the electronic components, comprising at least one device for enhancing the thermal conductivity comprising a dome-shaped surface, a pin and a lateral section surrounding the pin, the dome-shaped surface being connected to one end of the pin and to the lateral section, the dome-shaped surface being arranged on the second-face side, the free end of the pin being arranged on the first-face side.

The heat sink may be made of a material comprising graphite fibers held substantially parallel in a composite matrix.

The second face may be provided with at least one means for increasing the exchange surface of the heat sink with the medium into which the heat generated by the electronic components is to be dissipated, in particular a fin.

Two neighboring devices for enhancing the thermal conductivity may be connected through their lateral sections.

In a device for enhancing the thermal conductivity, the width of the pin may be equal to the thickness of the lateral section.

The lateral section of a device for enhancing the thermal conductivity may have an angle of 30° with the pin of said device for enhancing the thermal conductivity.

The heat sink may comprise removable attachment means.

BRIEF DESCRIPTION OF THE DRAWINGS

Other aims, features and advantages of the invention will become apparent from reading the following description, given solely by way of non-limiting examples, and with reference to the appended drawings, in which:

FIG. 3 illustrates a bird's eye view of a heat sink according to an aspect of the invention.

DETAILED DESCRIPTION OF THE PREFERRED EMBODIMENTS

The inventor had the idea of using a revolutionary composite material to form a heat sink by injection or molding.

Such a material comprises graphite fibers in a composite matrix. It will be recalled that graphite is a particular crystalline form of carbon forming a stack of sheets, each sheet having a honeycomb structure completely made of carbon and forming a single crystal. The thermal conductivity of such a crystal is particularly good in the plane of a sheet, of the order of 168 W/mK. The conductivity from one sheet to the next is then dependent on the conductivity of the medium in which the sheets are held, here the composite matrix. The conductivity of a polyamide composite matrix is of the order of 0.25 W/mK and varies according to the degree of polymerization. For comparison, the thermal conductivity of aluminum is 250 W/mK.

The material has the particular feature that the graphite fibers are oriented so as to be substantially parallel to each other and perpendicular to the surface to be thermally dissipated, for example the surface of the device. In doing so, the material exhibits a first thermal conductivity in the directions in a plane parallel to the plane of the graphite fibers, and a second thermal conductivity in the direction perpendicular to the plane of the graphite fibers. The first conductivity, of the order of 14 W/mK, is higher than the second conductivity, of the order of 5 W/mK.

Such a material is combined with a particular shape of the heat sink that makes it possible to maintain the orientation properties of the thermal conductivity of the material.

The heat sink according to an aspect of the invention takes the shape of a plate matching the surface of the circuit board or processor comprising the components generating heat to be dissipated.

Figure 1:
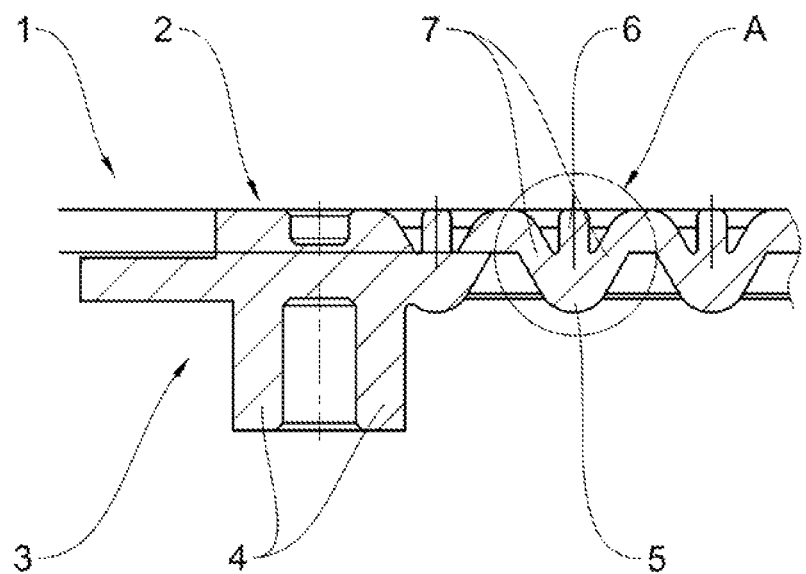
FIG. 1 illustrates a sectional view of the heat sink according to an aspect of the invention.

FIG. 1 illustrates a sectional view of the heat sink 1 comprising a first face 2 in contact with the components generating heat to be removed and a second face 3 in contact with the medium into which to dissipate the heat generated by the components.

In one particular embodiment, the second face 3 is provided with at least one means 4 for increasing the exchange surface, such as a fin.

The second face 3 also comprises at least one dome-shaped surface 5 corresponding to a first end of a pin 6 on the first face 2. The second end of the pin 6 is in direct or indirect contact with at least some of the components generating heat to be dissipated, potentially via a thermally conductive compound, of thermal-paste type.

Still in the sectional plane of FIG. 1, it can be seen that the first end of the pin 6 is connected on either side to a lateral section 7 surrounding the pin 6 whose external surfaces on the second-surface 3 side are comprised in part in the dome-shaped surface 5.

The dome-shaped surface 5, the pin 6 and the corresponding lateral section 7 form a device for enhancing the thermal conductivity. A heat sink 1 according to an aspect of the invention may comprise several devices for enhancing the thermal conductivity, each connected via their lateral sections 7.

Figure 2:
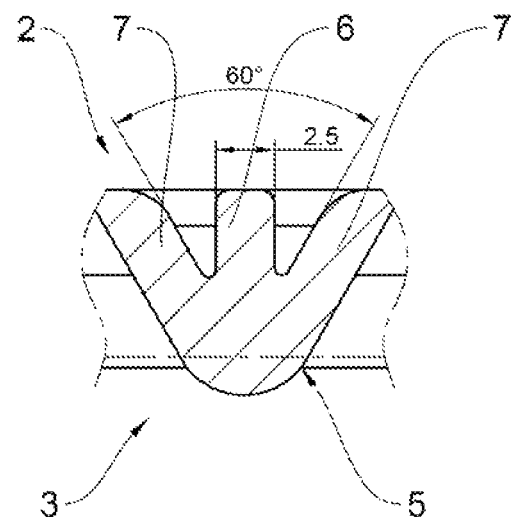
FIG. 2 illustrates a sectional view of a device for enhancing the thermal conductivity of a heat sink according to an aspect of the invention.

FIG. 2 illustrates a device for enhancing the thermal conductivity in more detail. It can be seen there that the width of the pin 6 is equal to the thickness of the lateral sections 7. It can also be seen that the lateral sections have an angle of 60° with respect to one another. Lastly, the dome-shaped surface has a radius of curvature of 3. This dimensioning makes it possible to best maintain, during injection molding, the alignment of the graphite fibers in the molding material.

A device for enhancing the thermal conductivity is thus obtained in which the thermal conductivity is best in a direction through the thickness of the heat sink.

FIG. 3 illustrates a bird's eye view of a heat sink according to an aspect of the invention, comprising five devices for enhancing the thermal conductivity arranged in a raised manner allowing the devices for enhancing the thermal conductivity to be placed in contact with the electronic components or processors arranged opposite. It can be seen that each device for enhancing the thermal conductivity comprises a pin 6 surrounded by a surface 7a in the form of a well resulting from the rotation of the internal surface of a lateral section 7 about the axis of revolution of the corresponding pin 6.

The heat sink is further provided with a shoulder making it possible to seal the components of the circuit board on which the heat sink 1 is arranged. Attachment means may be provided to attach the heat sink 1 to the corresponding circuit board, via screws and corresponding bores as illustrated in FIG. 3, or via any other removable attachment means.

The invention claimed is:

1. A heat sink comprising:
   a first face in contact with electronic components generating heat to be removed and a second face in contact with a medium into which to dissipate the heat generated by the electronic components,
   at least one device for enhancing a thermal conductivity comprising a dome-shaped surface, a pin and a lateral section surrounding the pin, the dome-shaped surface being connected to one end of the pin and to the lateral section, the dome-shaped surface having a round tip extending in a direction away from the first face,
   the dome-shaped surface being arranged on the second face, a free end of the pin being arranged on the first face,
   wherein the first face is a planar first face, and
   wherein the free end of the pin is on the planar first face, and a surface of the lateral section opposite the dome-shaped surface is arranged on the planar first face.

2. The heat sink as claimed in claim 1, wherein the heat sink is made of a material comprising graphite fibers held substantially parallel in a composite matrix.

3. The heat sink as claimed in claim 1, wherein the second face is provided with at least one means for increasing an exchange surface of the heat sink with the medium into which the heat generated by the electronic components is to be dissipated.

4. The heat sink as claimed in claim 1, comprising two neighboring devices for enhancing the thermal conductivity are connected through the lateral section of each of the two neighboring devices.

5. The heat sink as claimed in claim 1, wherein a width of the pin is equal to a thickness of the lateral section.

6. The heat sink as claimed in claim 1, wherein the lateral section has an angle of 30° with the pin of the at least one device for enhancing the thermal conductivity.

7. The heat sink as claimed in claim 1, comprising removable attachment means.

8. The heat sink as claimed in claim 1, wherein the second face is provided with a fin for increasing an exchange surface of the heat sink with the medium into which the heat generated by the electronic components is to be dissipated.

9. The heat sink as claimed in claim 2, wherein the second face is provided with a fin for increasing an exchange surface of the heat sink with the medium into which the heat generated by the electronic components is to be dissipated.

* * * * *